(12) United States Patent
Chen et al.

(10) Patent No.: US 11,772,137 B2
(45) Date of Patent: Oct. 3, 2023

(54) REACTIVE CLEANING OF SUBSTRATE SUPPORT

(71) Applicant: Applied Materials, Inc., Santa Clara, CA (US)

(72) Inventors: Xi Chen, San Jose, CA (US); Shreesha Yogish Rao, Milpitas, CA (US); Sheng Guo, Oakland, CA (US); Chi H. Ching, Mountain View, CA (US); Thomas Blasius Brezoczky, Los Gatos, CA (US); Cheng-Hsiung Tsai, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 34 days.

(21) Appl. No.: 17/384,096

(22) Filed: Jul. 23, 2021

(65) Prior Publication Data
US 2023/0029265 A1 Jan. 26, 2023

(51) Int. Cl.
*H01J 37/32* (2006.01)
*B08B 7/00* (2006.01)
*B08B 13/00* (2006.01)

(52) U.S. Cl.
CPC .......... *B08B 7/0035* (2013.01); *B08B 13/00* (2013.01); *H01J 37/32082* (2013.01); *H01J 37/32357* (2013.01); *H01J 37/32715* (2013.01); *H01J 37/32834* (2013.01); *H01J 37/32935* (2013.01); *H01J 2237/2007* (2013.01); *H01J 2237/335* (2013.01); *H01J 2237/3341* (2013.01)

(58) Field of Classification Search
CPC .. B08B 7/0035; B08B 13/00; H01J 37/32082; H01J 37/32357; H01J 37/32715; H01J 37/32834; H01J 37/32935; H01J 2237/2007; H01J 2237/3341; H01J 2237/335
See application file for complete search history.

(56) References Cited

U.S. PATENT DOCUMENTS

| | | | |
|---|---|---|---|
| 5,886,865 A * | 3/1999 | Parkhe | H02N 13/00 361/233 |
| 6,992,876 B1 | 1/2006 | Nakajima et al. | |
| 2004/0182415 A1* | 9/2004 | Yoon | B08B 7/00 134/1.2 |
| 2011/0114114 A1 | 5/2011 | You et al. | |

(Continued)

FOREIGN PATENT DOCUMENTS

| | | |
|---|---|---|
| JP | 2002280376 A | 9/2002 |
| WO | 2011031860 A1 | 3/2011 |

OTHER PUBLICATIONS

PCT International Search Report and Written Opinion in PCT/US2022/033928 dated Oct. 13, 2022, 10 pages.

*Primary Examiner* — Erin F Bergner
(74) *Attorney, Agent, or Firm* — Servilla Whitney LLC

(57) ABSTRACT

Methods of cleaning a substrate support comprise: introducing a cleaning gas into a processing chamber containing the substrate support; applying a radio frequency (RF) power to a remote plasma source that is in fluid communication with the processing chamber to establish a reactive etching plasma from the cleaning gas in the processing chamber; reacting deposits on the substrate support with the reactive etching plasma to form a by-products phase; and evacuating the by-products phase from the processing chamber.

20 Claims, 4 Drawing Sheets

(56) References Cited

U.S. PATENT DOCUMENTS

| | | | |
|---|---|---|---|
| 2015/0228463 A1* | 8/2015 | Manna | ................... C23C 16/26 427/249.1 |
| 2018/0366378 A1 | 12/2018 | Kim et al. | |
| 2019/0382889 A1 | 12/2019 | Parimi et al. | |
| 2020/0255940 A1 | 8/2020 | Kwon et al. | |
| 2021/0086239 A1 | 3/2021 | Ulavi et al. | |

* cited by examiner

REACTIVE CLEANING OF SUBSTRATE SUPPORT

TECHNICAL FIELD

The present disclosure relates generally to apparatus and methods for processing substrates. In particular, embodiments of the disclosure are directed to apparatus and methods for cleaning a substrate support by using a remote plasma generator (RPS) to establish a reactive etching plasma from a cleaning gas. A by-products phase from reaction of deposits on the substrate support with the reactive etching plasma is then evacuated away from the substrate support.

BACKGROUND

Many deposition processes benefit from maintaining a uniform and small gap between a surface of a gas distribution plate and a substrate being processed, the substrate being positioned on a substrate support. For example, atomic layer deposition processes (ALD) often have a very small substrate to gas injector spacing. Variations in this gap can cause changes in the flow uniformity of gases across the substrate surface. The gap variations are even more prominent when the substrate is moved between processing stations. Multiple deposition processing cycles may result in non-uniformity and flatness variation of a surface of the substrate support due to, for example, deposits of residual particles and/or films resulting from processing chemistry and conditions. Changes in the flatness of the substrate support increase variations in the reaction space between the gas injector and the substrate.

For processes at elevated temperatures, substrate supports, which can include an electrostatic chuck, are heated. At high temperature, contaminants, such as carbon groups and carbon chains, build up, in the form of deposits, on a surface of the substrate support, e.g., a surface of the electrostatic chuck, which can change resistivity of a ceramic layer of the chuck and impact chucking force. For example, charge on the surface of the electrostatic chuck can become shorted by carbon-based contaminants, e.g., by ways of a conductive film, which lowers charge potential at the surface, so that the chucking force becomes weak.

Cleaning substrate support surfaces after multiple cycles can improve uniformity and flatness. Use of radio frequency (RF) plasma generated in the processing chamber to etch chuck contaminants to clean up the surface can result in redistributing sputtered particles from the chuck surface to somewhere in chamber, but does not remove the contaminants from the processing chamber.

Generally, there is a continuing need in the art to clean surfaces of substrate supports, in particular, to reactively remove deposits from surfaces of heated electrostatic chucks.

SUMMARY

One or more embodiments are directed to methods of cleaning substrate supports. A cleaning gas is introduced into a processing chamber containing the substrate support. A radio frequency (RF) power is applied to a remote plasma source that is in fluid communication with the processing chamber to establish a reactive etching plasma from the cleaning gas in the processing chamber. Deposits on the substrate support react with the reactive etching plasma to form a by-products phase. The by-products phase is evacuated from the processing chamber.

Additional embodiments are directed to methods of cleaning substrate supports. A temperature of an electrostatic chuck of the substrate support is set in a range of greater than or equal to 100° C. to less than or equal to 600° C. A cleaning gas comprising oxygen is introduced into a processing chamber containing the substrate support, processing chamber being under vacuum pressure. A radio frequency (RF) power is applied to a remote plasma source that is in fluid communication with the processing chamber to establish a reactive etching plasma from the cleaning gas in the processing chamber. Deposits on the substrate support react with the reactive etching plasma to form a by-products phase. The by-products phase is evacuated from the processing chamber.

Further embodiments of the disclosure are directed to non-transitory computer readable mediums. The non-transitory computer readable mediums include instructions. When the instructions are executed by a controller of a processing chamber, the processing chamber performs operations of: setting a remote plasma source that is in fluid communication with the processing chamber containing a substrate support that comprises an electrostatic chuck and a heater to one or more following conditions: a bias power in a range of greater than or equal to 10 W to less than or equal to 250 W; a reflective power of less than 50% of the bias power; and a pressure in a range of less than or equal to 5 mTorr to less than or equal to 2 Torr; setting a temperature of the electrostatic chuck in a range of greater than or equal to 100° C. to less than or equal to 600° C.; introducing a cleaning gas into the processing chamber; applying a radio frequency (RF) power to a remote plasma source that is in fluid communication with the processing chamber to establish a reactive etching plasma from the cleaning gas in the processing chamber; and evacuating a by-products phase resulting from reacting deposits on the substrate support with reactive species of the cleaning gas from the processing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
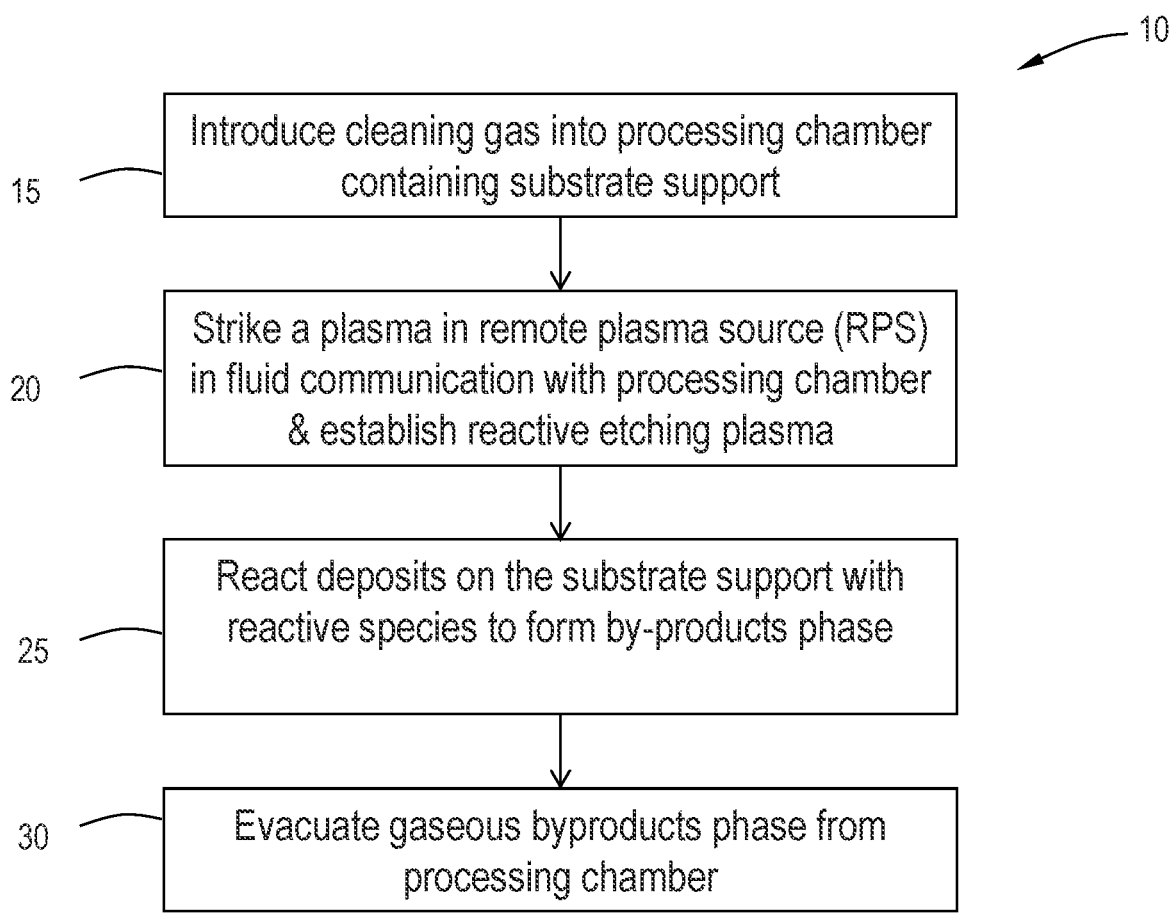
FIG. 1 shows a flowchart of a method of cleaning a substrate support in accordance with one or more embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label. The cross-hatch shading of the components in the figures are intended to aid in visualization of different parts and do not necessarily indicate different materials of construction.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

Reference to a "cleaning gas" means a gaseous material made up of one or more components or precursors that will generate free radicals upon application of radio frequency (RF) energy, which thereby establishes a reactive etching plasma.

Embodiments of the disclosure are directed to apparatus and methods for cleaning surfaces of substrate supports or pedestals. Some embodiments provide a reactive plasma with oxygen background to convert surface deposits (or contamination) to by-products in a pumpable gaseous phase so that the by-products can be completely pumped out of chamber without sputtering particles everywhere or damaging the substrate support (or chucking) surface. Embodiments of the disclosure are advantageously usable with, for example, periodic pedestal surface cleaning, seasoning a pedestal heater surface after cleaning; treating the surface of the pedestal and cleaning the wafer backside or bevel.

An "electrostatic chuck" (ESC) uses a non-mechanical clamping method to hold substrates or wafers during wafer processing. An ESC is composed of a dielectric layer positioned between the wafer and one or two conductive electrodes. A bias voltage is applied to the wafer through the ESC embedded electrode to establish an electrostatic holding force to clamp the wafer against its dielectric surface, thereby "chucking" the wafer.

Electrostatic force associated with substrate supports or pedestals are sensitive to contaminants on the surface, which can change two factors: (1) contact between electrostatic chuck and wafer, and (2) loss of electrostatic charge. Contaminants will increase distance between the electrostatic chuck and wafer, which decreases chucking force due to contact decrease. In addition, charge on the surface of the chuck can get 'shorted' by contaminant carbon conductive films, which lower the charge potential at the surface, so that the chucking force becomes weak. At high temperature, the contaminants (typically carbon and carbon chains) build up on electrostatic chuck surface, which change the resistivity of chuck ceramic and effect chucking force.

One or more embodiments of the disclosure are advantageously utilized for Johnsen-Rahbek (J-R)-type bipolar electrostatic chucks, which are widely used to hold wafer in the high temperature process. In the J-R type chuck, the dielectric resistivity is targeted to control the charges transferring from the electrode to the top surface of the dielectric layer. In a bipolar chuck, the electrodes flip polarity (one is positive while the other is negative). Functionally, it is the magnitude of potential difference of opposite charges on the surfaces that creates the force and so while there is an electrical field again, it is the magnitude of the potential that matters.

One or more embodiments of the disclosure advantageously replace sputter etch cleaning processes, chemical cleaning, and/or mechanical cleaning, and eliminate their corresponding disadvantages. For example, etch cleaning processes tend to only redistribute sputtered materials from the chuck surface to somewhere else in the chamber, which can lead to random defect excursions as well as recontamination of the chuck surface. In addition, removal of carbon and carbon chain contaminations can be difficult with etching alone. Etching processes have the potential to damage the chuck. Further, some etching processes require additional chamber qualification, which can interrupt wafer process and delay productivity. With specific respect to PVD, hardware associated with etching needs to be removed from the PVD chamber after clean process, which in turn necessitates opening the process chamber, and introducing the potential for new particle contamination into the system.

In one or more embodiments, the cleaning methods remove contaminants from the chamber upon their reaction and formation of a by-products gaseous phase. The methods herein physiochemically remove deposits in any form, for example a conductive layer, which is converted to a pumpable gas phase that can be completely removed from the chamber without decontamination problem. The methods offer a defect-free clean process that can avoid particle problems. There is less possibility to damage the chuck as compared to the etching processes. The reactive processes herein are effective to remove carbon and carbon chain contaminants. In one or more embodiments, uniform cleaning results and a low operating pressure requirement. In one or more embodiments, a remote plasma source remains in-situ and can be executed at any time (before or even between wafer running) without requiring any change to the process hardware or impact to process. The methods can be automatically running as needed without requiring additional chamber qualification or delaying process, which results in the improved productivity. In one or more embodiments, the methods are highly efficient, for example, requiring only 2 to 4 hours to clean the chuck. Use of a removable and remote plasma source can target various contaminants (not only carbon and carbon chains) based on the source power and gas species.

FIG. 1 shows a shows a flowchart of a method 10 of cleaning a substrate support in accordance with one or more embodiments. At operation 15, a cleaning gas is introduced into a processing chamber containing a substrate support. At operation 20, a plasma is struck in a remote plasma source that is in fluid communication with the processing chamber. That is, a radio frequency (RF) power is applied to the remote plasma source, which establishes a reactive etching plasma from the cleaning gas in the processing chamber. Free radicals of the cleaning gas are effective to react with deposits (e.g., contaminants such as carbon and/or carbon chains) on the substrate support. Other contaminants such as hydroxy group-containing compounds; water; and hydrocarbons could also be present on the surface. At operation 25, deposits on the substrate support are reacted with the reactive etching plasma to form a by-products phase. At operation 30, the by-products phase is evacuated from the processing chamber.

In one or more embodiments, the processing chamber is under a vacuum pressure. Vacuum pressure may be achieved by methods known in the art, such as by operating a vacuum pump on the processing chamber.

In one or more embodiments, introducing of the cleaning gas comprises flowing the cleaning gas through the remote plasma source. In one or more embodiments, the introducing of the cleaning gas comprises flowing the cleaning gas directly into the processing chamber. In one or more embodiments, the introducing of the cleaning gas comprises flowing the cleaning gas directly into the processing chamber and through the RPS.

In one or more embodiments, operating the remote plasma source includes one or more following conditions: a bias power in a range of greater than or equal to 10 W to less than or equal to 250 W, and all values and subranges therebetween; a reflective power of less than the bias power, for example less than 125 W; and a pressure in a range of less than or equal to 5 mTorr to less than or equal to 2 Torr. A tuning voltage is set in accordance with controlling power. In one or more embodiments, the tuning voltage is in a range of greater than or equal to 5 volts to less than or equal to 6 volts.

In one or more embodiments, the cleaning gas comprises one or more components or precursors that will generate free radicals upon application of radio frequency (RF) energy.

In one or more embodiments, the cleaning gas comprises oxygen. In one or more embodiments, the cleaning gas consists essentially of or consists of oxygen. In one or more embodiments, the cleaning gas comprises nitrogen and oxygen. In one or more embodiments, the cleaning gas is an air supply.

In one or more embodiments, the cleaning gas comprises a fluorine-based compound. In one or more embodiments, the cleaning gas consists essentially of or consists of a fluorine-based compound.

In one or more embodiments, a temperature of an electrostatic chuck of the substrate support is set in a range of greater than or equal to 100° C. to less than or equal to 600° C., and all values and subranges therebetween.

In one or more embodiments, duration of cleaning, e.g., operating the remote plasma source is based on time.

During cleaning may be tailored according to process monitoring. For example, contamination of a surface of a substrate support can be detected by mapping surface potential. An electrostatic voltmeter is one way to accurately measure surface potential (voltage) on chuck surface in order to detect a contaminant conductive film.

Contamination of a surface of a substrate support can also be detected by measuring leakage current. Contaminants such as carbon changes surface conductivity. With voltage applied, a leakage current can reflect the contamination degree. By watching leakage current, cleaning methods herein can be run automatically as needed without requiring additional chamber qualification or process interruption.

In one or more embodiments, methods further comprise monitoring measurements of a leakage current of the substrate support, specifically the electrostatic chuck. In some embodiments, commencement of operating the remote plasma source is based on the measurements of the leakage current of the substrate support, or the electrostatic chuck. In some embodiments, a duration of operating the remote plasma source is based on the measurements of the leakage current.

Backside pressure measurements can be used to determine the backside gas leakage due to the contamination. As an example, chucking voltage can be decreased to a desired amount to determine a minimum voltage that the chuck can hold a wafer at no less than a desired backside pressure with a desired gas flow.

Further, particle map data can provide useful information about the chuck performance and condition. The magnitude and uniformity of chucking force can be assessed by collect a backside particle map. The particle sputtering effect to the chamber by the methods herein can be evaluated by collect a frontside particle map.

Figure 2:
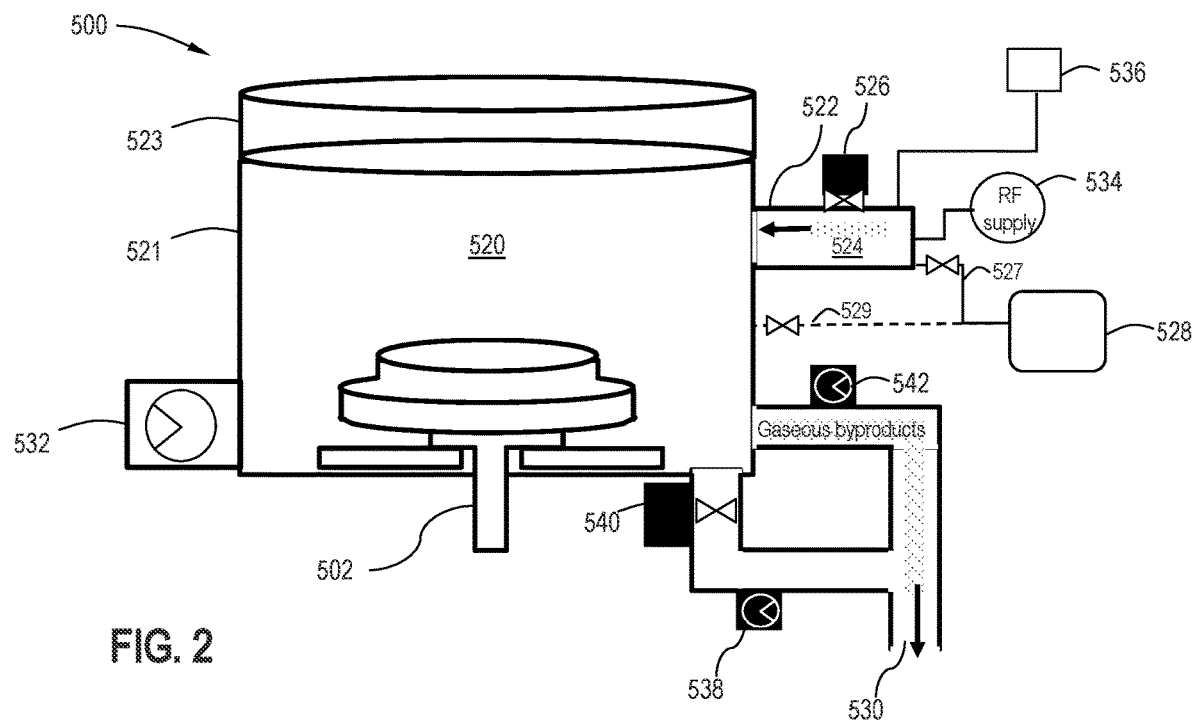
FIG. 2 shows a schematic view of a processing chamber in accordance with one or more embodiments.

Turning to FIG. 2, a processing chamber 500 in accordance with one or more embodiments comprises: a processing cavity 520 defined by chamber walls 521 and a chamber lid 523. The processing chamber 500 contains a substrate support 502. The process chamber 500 is exemplary, and representative of an annealing chamber where are minimal internal features in the processing cavity 520. Methods herein would also apply to sputtering chambers, where internal features such as wall liners and/or a chamber cathode may be present.

A remote plasma source (RPS) unit 522 is in fluid communication with (e.g., fluidly connected to) the processing chamber 500 containing the substrate support 522. The RPS is used to establish a reactive etching plasma into the processing chamber from the cleaning gas. Suitable plasmas are low-density plasmas, typically up to 80 W bias power. Bias power is used to sustain the plasma density and generate the clean energy. Suitable RPS units provide an in-situ plasma source device (removable and remote-control). The RPS unit strikes the plasma (visible) upon application of radio frequency (RF) power. The RPS unit adjusts operating pressure with changing the gas inflow rate. The RPS unit permits a wide pressure range (5 mTorr to 2 Torr) allows carbon removal at appropriate speeds without danger to the pump or interruption of system interlock software. A controller 536 is configured to remotely power and operate the RPS unit 522. In one or more embodiments, the controller 536 sets, monitors, and changes operating power from 10 to 250 Watts, and all values and subranges therebetween, during a run. In one or more embodiments, the controller 525 controls gas supply 528 inflow on/off. Some RPS units include a color indicator that plasma has been stroked successfully. Exemplary other settings of the RPS unit include: source power at 80 W; reflective Power less than 3; and tuning voltage: within range 5 to 6V.

Although FIG. 2 shows the RPS 522 installed through a chamber wall 521, it is understood that the RPS 522 could alternatively be installed through the lid 523. The RPS 522 includes a volume 524, where the plasma is struck. An RPS needle valve 526 maintains process pressure. In one or more embodiments, the process pressure is 130 mTorr. A radio frequency source 534 serves as a power supply. A cryo pump 532 is optionally assembled with the chamber 500, but is generally not used during the cleaning process.

A cleaning gas source 528 is in fluid communication during the cleaning operation with the processing chamber 500. In one or more embodiments, a cleaning gas is supplied to the volume 524 of the RPS 522 by a process line 527. In one or more embodiments, the cleaning gas is supplied directly to the processing chamber 520 by a process line 529. In one or more embodiments, the cleaning gas is supplied both directly to the processing chamber 520 and to the volume 524 of the RPS 522. Upon application of a radio frequency (RF) power to the remote plasma source, a reactive etching plasma from the cleaning gas is established in the processing chamber. The reactive etching plasma reacts with deposits on the substrate support for form a by-products phase. In one or more embodiments, the by-products phase is gaseous.

A discharge passage 530 directs a by-products phase out of the processing chamber 500. The discharge passage 530 comprises valving 540 and pumps 538, 542, as-needed.

Figure 3:
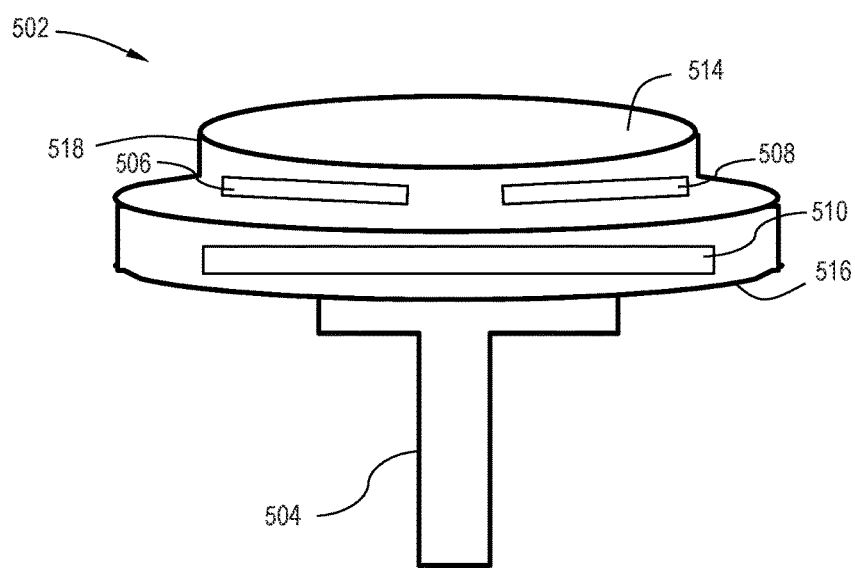
FIG. 3 shows a schematic view of a substrate support in accordance with one or more embodiments.

FIG. 3 shows a schematic view of a substrate support 502 in accordance with one or more embodiments. In one or more embodiments, the substrate support 502 comprises an electrostatic chuck (ESC) 518. In one or more embodiments, a heater 510 is included in the substrate support. Other embodiments may include a heater external to the substrate support, located in the processing chamber. Electrodes 506 and 508 flip polarity during use. A central base 504 connects the electrodes 506 and 508 to the ESC 518. Top surface 514 is subject to deposits of contamination during processing of wafers. Undersurface 516 is also subject to deposits of contamination during processing of wafers.

Figure 4A:
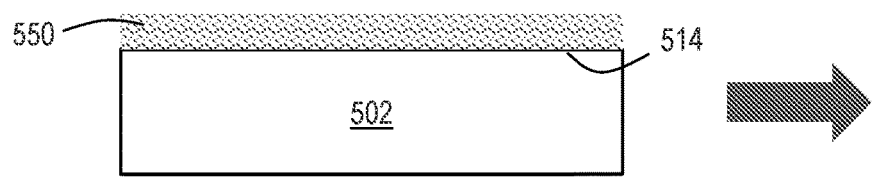
FIGS. 4A, 4B, and 4C show schematic views of a substrate surface at different times of a method in accordance with one or more embodiments.
Figure 4B:
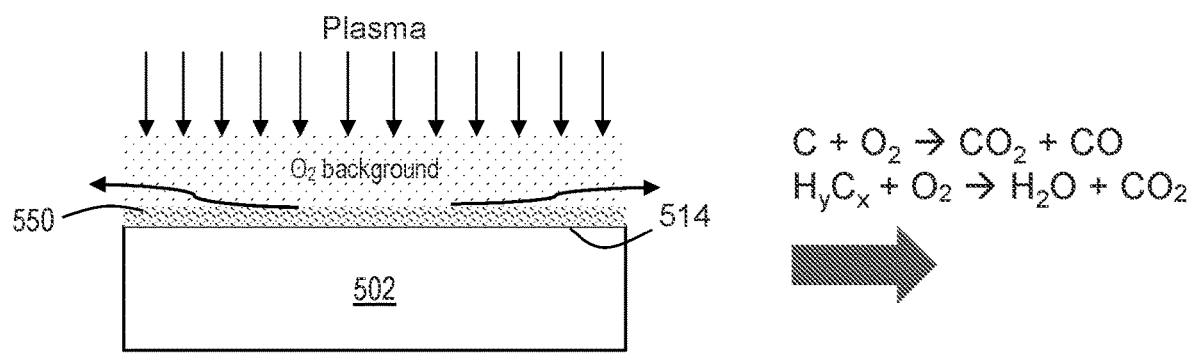
Figure 4C:
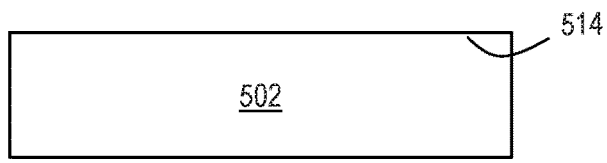

FIGS. 4A, 4B, and 4C show schematic views of a substrate surface 514 at different times of a method in accordance with one or more embodiments. In FIG. 4A, deposits 550 of contamination are on the surface 514. Carbon and carbon chains are typically difficult materials to remove by etching along. Upon exposure to plasma and an oxygen background as shown in FIG. 4B, the cleaning process uses $O_2$ to, for example, ash graphite contaminate film on the surface 514 to reduce the amount of deposits 550 until the material is all reacted away, thereby recovering a clean surface 514 as shown in FIG. 4C.

The cleaning methods herein convert ESC surface contaminates (such as carbon, OH, $H_2O$, $H_yC_x$, etc.) through reaction with $O_2$ to COx by-products and $H_2O$. COx by-products and H2O generated are pumped down in gas phase.

It is understood that deposits of contamination on an undersurface will also be cleaned in accordance with methods herein.

Figure 5:
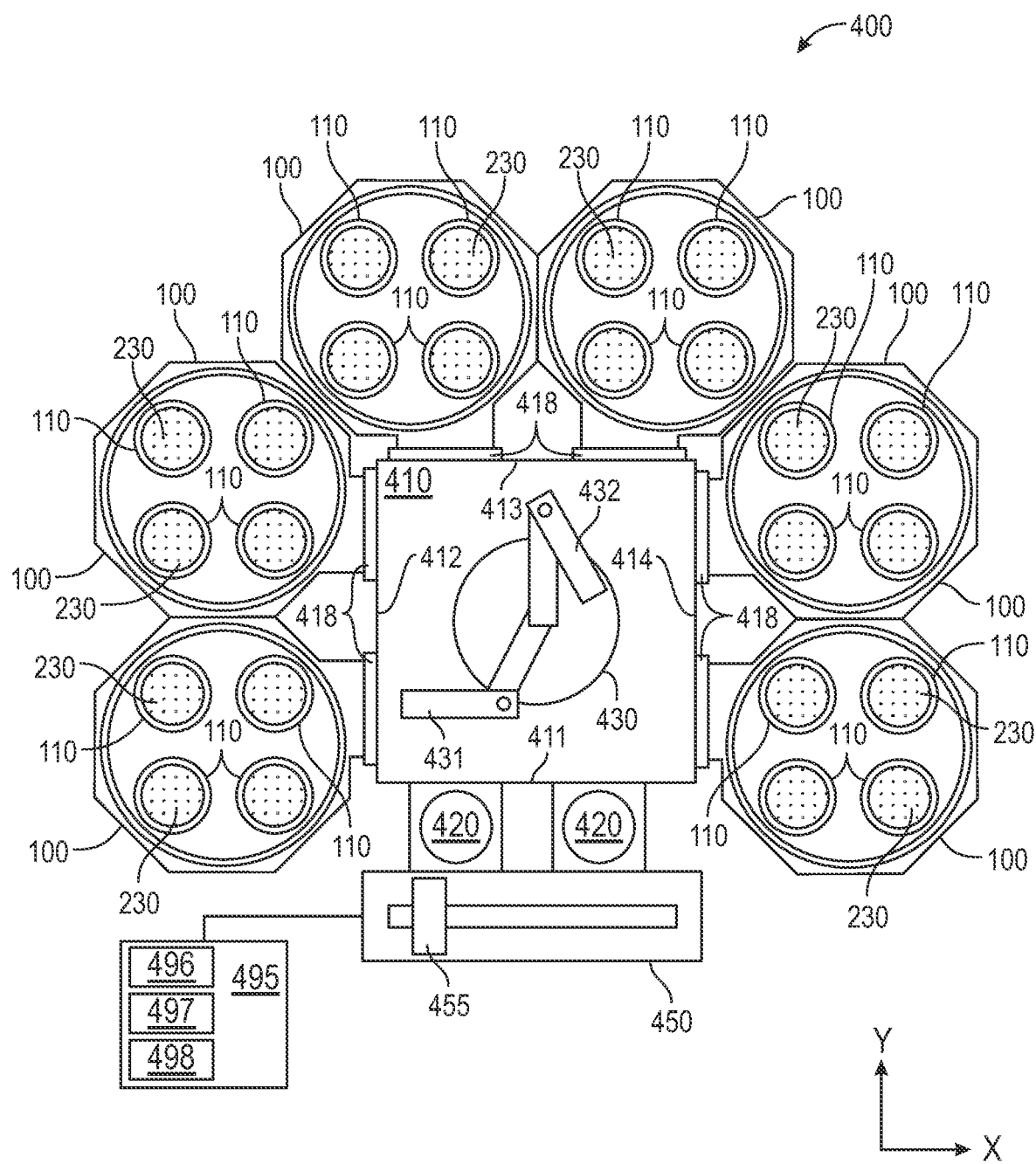
FIG. 5 is a schematic representation of a processing platform in accordance with one or more embodiments.

FIG. 5 shows a processing platform 400 in accordance with one or more embodiments of the disclosure. The embodiment shown in FIG. 5 is merely representative of one possible configuration and should not be taken as limiting the scope of the disclosure. For example, in some embodiments, the processing platform 400 has a different numbers of one or more of the processing chambers 100, buffer stations 420 and/or robot 430 configurations than the illustrated embodiment.

The exemplary processing platform 400 includes a central transfer station 410 which has a plurality of sides 411, 412, 413, 414. The transfer station 410 shown has a first side 411, a second side 412, a third side 413 and a fourth side 414. Although four sides are shown, those skilled in the art will understand that there can be any suitable number of sides to the transfer station 410 depending on, for example, the overall configuration of the processing platform 400. In some embodiments, there the transfer station 410 has three sides, four sides, five sides, six sides, seven sides or eight sides.

The transfer station 410 has a robot 430 positioned therein. The robot 430 can be any suitable robot capable of moving a substrate during processing. In some embodiments, the robot 430 has a first arm 431 and a second arm 432. The first arm 431 and second arm 432 can be moved independently of the other arm. The first arm 431 and second arm 432 can move in the x-y plane and/or along the z-axis. In some embodiments, the robot 430 includes a third arm (not shown) or a fourth arm (not shown). Each of the arms can move independently of other arms.

The embodiment illustrated includes six processing chambers 100 with two connected to each of the second side 412, third side 413 and fourth side 414 of the central transfer station 410. Each of the processing chambers 100 can be configured to perform different processes.

The processing platform 400 can also include one or more buffer station 420 connected to the first side 411 of the central transfer station 410. The buffer stations 420 can perform the same or different functions. For example, the buffer stations may hold a cassette of substrates which are processed and returned to the original cassette, or one of the buffer stations may hold unprocessed substrates which are moved to the other buffer station after processing. In some embodiments, one or more of the buffer stations are configured to pre-treat, pre-heat or clean the substrates before and/or after processing.

The processing platform 400 may also include one or more slit valves 418 between the central transfer station 410 and any of the processing chambers 100. The slit valves 418 can open and close to isolate the interior volume within the processing chamber 100 from the environment within the central transfer station 410. For example, if the processing chamber will generate plasma during processing, it may be helpful to close the slit valve for that processing chamber to prevent stray plasma from damaging the robot in the transfer station.

The processing platform 400 can be connected to a factory interface 450 to allow substrates or cassettes of substrates to be loaded into the processing platform 400. A robot 455 within the factory interface 450 can be used to move the substrates or cassettes into and out of the buffer stations. The substrates or cassettes can be moved within the processing platform 400 by the robot 430 in the central transfer station 410. In some embodiments, the factory interface 450 is a transfer station of another cluster tool (i.e., another multiple chamber processing platform).

A controller 495 may be provided and coupled to various components of the processing platform 400 to control the operation thereof. The controller 495 can be a single controller that controls the entire processing platform 400, or multiple controllers that control individual portions of the processing platform 400. For example, the processing platform 400 of some embodiments comprises separate controllers for one or more of the individual processing chambers 100, central transfer station 410, factory interface 450 and/or robots 430.

In some embodiments, the processing chamber 100 further comprises a controller 495 connected to the plurality of substantially coplanar support surfaces 231 configured to control one or more of the first temperature or the second temperature. In one or more embodiments, the controller 495 controls a movement speed of the support assembly 200 (see FIG. 2).

In some embodiments, the controller 495 includes a central processing unit (CPU) 496, a memory 497, and support circuits 498. The controller 495 may control the processing platform 400 directly, or via computers (or controllers) associated with particular process chamber and/or support system components.

The controller 495 may be one of any form of general-purpose computer processor that can be used in an industrial setting for controlling various chambers and sub-processors. The memory 497 or computer readable medium of the controller 495 may be one or more of readily available memory such as random access memory (RAM), read only memory (ROM), floppy disk, hard disk, optical storage media (e.g., compact disc or digital video disc), flash drive, or any other form of digital storage, local or remote. The memory 497 can retain an instruction set that is operable by the processor (CPU 496) to control parameters and components of the processing platform 400.

The support circuits 498 are coupled to the CPU 496 for supporting the processor in a conventional manner. These circuits include cache, power supplies, clock circuits, input/output circuitry and subsystems, and the like. One or more processes may be stored in the memory 498 as software routine that, when executed or invoked by the processor, causes the processor to control the operation of the processing platform 400 or individual processing chambers in the manner described herein. The software routine may also be stored and/or executed by a second CPU (not shown) that is remotely located from the hardware being controlled by the CPU 496.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 495 has one or more configurations to execute individual processes or sub-processes to perform the method. The controller 495 can be connected to and configured to operate intermediate components to perform the functions of the methods. For example, the controller 495 can be connected to and configured to control one or more of gas valves, actuators, motors, slit valves, vacuum control or other components.

The controller 495 of some embodiments has one or more configurations selected from: a configuration to set a remote plasma source that is in fluid communication with the processing chamber containing a substrate support that includes an electrostatic chuck to one or more following conditions: a bias power in a range of greater than or equal to 10 W to less than or equal to 250 W; a reflective power of less than 50% of the bias power; and a pressure in a range of less than or equal to 5 mTorr to less than or equal to 2 Torr; set a temperature of the electrostatic chuck in a range of greater than or equal to 100° C. to less than or equal to 600° C.; introduce a cleaning gas into the processing chamber; apply a radio frequency (RF) power to a remote plasma source that is in fluid communication with the processing chamber to establish a reactive etching plasma from the cleaning gas in the processing chamber; and evacuate a by-products phase resulting from reacting deposits on the substrate support with the reactive etching plasma from the processing chamber.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of cleaning a substrate support, the method comprising:
   introducing a cleaning gas consisting essentially of oxygen into a processing chamber containing the substrate support;
   applying a radio frequency (RF) power to a remote plasma source including a remote plasma source volume where a plasma is struck and that is in fluid communication with the processing chamber to establish a reactive etching plasma that generates free radicals of the cleaning gas in the processing chamber;
   reacting carbon-containing deposits on the substrate support with free radicals of the cleaning gas to form a gaseous by-products phase; and
   evacuating the gaseous by-products phase from the processing chamber.

2. The method of claim 1, wherein the introducing of the cleaning gas comprises directing the cleaning gas through the remote plasma source.

3. The method of claim 1, wherein the introducing of the cleaning gas comprises directing the cleaning gas directly into the processing chamber.

4. The method of claim 1, wherein operating the remote plasma source comprises setting a bias power in a range of greater than or equal to 10 W to less than or equal to 250 W; setting a reflective power of less than 50% of the bias power; and setting a pressure in a range of 5 mTorr to less than or equal to 2 Torr.

5. The method of claim 1, wherein the processing chamber is under a vacuum pressure.

6. The method of claim 4, wherein the substrate support comprises a Johnsen-Rahbek-type bipolar electrostatic chuck.

7. The method of claim 1, wherein the substrate support comprises a Johnsen-Rahbek-type bipolar electrostatic chuck and at least one electrode.

8. The method of claim 1, further comprising setting a temperature of the substrate support in a range of greater than or equal to 100° C. to less than or equal to 600° C.

9. The method of claim 1, further comprising monitoring measurements of a leakage current of the substrate support.

10. The method of claim 9, wherein a duration of operating the remote plasma source is based on the measurements of the leakage current.

11. The method of claim 1, further comprising striking the reactive etching plasma in the remote plasma source volume and not striking a plasma in the processing chamber.

12. A method of cleaning a substrate support, the method comprising:
   setting a temperature of a bipolar electrostatic chuck of the substrate support in a range of greater than or equal to 100° C. to less than or equal to 600° C.;
   introducing a cleaning gas consisting essentially of oxygen into a processing chamber containing the substrate support, the processing chamber being under vacuum pressure;
   applying a radio frequency (RF) power to a remote plasma source having a remote plasma source volume where a plasma is struck and that is in fluid communication with the processing chamber to establish a reactive etching plasma that generates free radicals of the cleaning gas in the processing chamber;
   reacting carbon-containing deposits on the bipolar electrostatic chuck of the substrate support with the free radicals of the cleaning gas to form a gaseous by-products phase; and
   evacuating the gaseous by-products phase from the processing chamber.

13. The method of claim 12, wherein operating the remote plasma source comprises: setting a bias power in a range of greater than or equal to 10 W to less than or equal to 250 W; setting a reflective power of less than 50% of the bias power; and setting a pressure in a range of 5 mTorr to less than or equal to 2 Torr.

14. The method of claim 13, further comprising monitoring measurements of a leakage current of the bipolar electrostatic chuck.

15. The method of claim 13, further comprising striking the reactive etching plasma in the remote plasma source volume and not generating a plasma in the processing chamber.

16. A non-transitory computer readable medium, including instructions, that, when executed by a controller of a processing chamber, causes the processing chamber to perform operations of:
   setting a remote plasma source a bias power in a range of greater than or equal to 10 W to less than or equal to 250 W; a reflective power of less than 50% of the bias power; and a pressure in a range of less than or equal to 5 mTorr to less than or equal to 2 Torr;
   setting a temperature of a bipolar electrostatic chuck in a range of greater than or equal to 100° C. to less than or equal to 600° C.;
   introducing a cleaning gas consisting essentially of oxygen into the processing chamber;
   applying a radio frequency (RF) power to the remote plasma source having a remote plasma source volume that is in fluid communication with the processing chamber to strike a plasma in the remote plasma source volume and to establish a reactive etching plasma that generates free radicals of the cleaning gas in the processing chamber; and
   evacuating a gaseous by-products phase resulting from reacting carbon-containing deposits on the substrate support with the free radicals of the cleaning gas from the processing chamber.

17. The non-transitory computer readable medium of claim 16, comprising the operation of setting a pressure of the processing chamber to a vacuum pressure.

18. The non-transitory computer readable medium of claim 16, wherein the processing chamber performs an operation comprising monitoring measurements of a leakage current of the bipolar electrostatic chuck.

19. The non-transitory computer readable medium of claim 16, wherein a duration of operating the remote plasma source is based on measurements of the leakage current of the electrostatic chuck.

20. The non-transitory computer readable medium of claim 16, wherein the substrate support comprises a Johnsen-Rahbek-type bipolar electrostatic chuck.

* * * * *